(12) United States Patent
Lemke

(10) Patent No.: US 6,918,017 B1
(45) Date of Patent: Jul. 12, 2005

(54) METHOD AND APPARATUS FOR FAULT-TOLERANT UPDATE OF FLASH ROM CONTENTS

(75) Inventor: Steve Lemke, Sunnyvale, CA (US)

(73) Assignee: PalmSource, Inc., Sunnyvale, CA (US)

(*) Notice: Subject to any disclaimer, the term of this patent is extended or adjusted under 35 U.S.C. 154(b) by 0 days.

(21) Appl. No.: 10/786,969

(22) Filed: Feb. 24, 2004

Related U.S. Application Data

(63) Continuation of application No. 09/590,936, filed on Jun. 8, 2000, now Pat. No. 6,880,048.

(51) Int. Cl.$^7$ .............................................. G06F 12/00
(52) U.S. Cl. ...................... 711/154; 711/102; 711/103; 713/2
(58) Field of Search ................................ 711/154, 102, 711/103, 156; 713/1–2

(56) References Cited

U.S. PATENT DOCUMENTS

| | | | | |
|---|---|---|---|---|
| 5,022,077 A | * | 6/1991 | Bealkowski et al. | 711/163 |
| 5,692,190 A | * | 11/1997 | Williams | 713/2 |
| 5,793,630 A | * | 8/1998 | Theimer et al. | 700/11 |
| 5,949,997 A | * | 9/1999 | Smith | 713/2 |
| 5,960,445 A | * | 9/1999 | Tamori et al. | 707/203 |
| 5,987,605 A | * | 11/1999 | Hill et al. | 713/2 |
| 6,044,461 A | * | 3/2000 | Agha et al. | 713/1 |
| 6,138,233 A | * | 10/2000 | Lim | 713/1 |
| 6,421,777 B1 | * | 7/2002 | Pierre-Louis et al. | 713/2 |
| 6,542,981 B1 | * | 4/2003 | Zaidi et al. | 712/2 |
| 2003/0074549 A1 | * | 4/2003 | Paul et al. | 713/2 |

* cited by examiner

*Primary Examiner*—Matthew D. Anderson
(74) *Attorney, Agent, or Firm*—Berry & Associates P.C.

(57) ABSTRACT

Method and apparatus for updating the contents of a first memory of a computer system. In one embodiment, new information intended for the first memory is received by the computer system from an external source, wherein the first memory is for storing information that is required during startup of the computer system. The new information thus received is stored in a second memory capable of retaining information stored therein upon a restart of the computer system. The computer system is restarted without relying on the new information. The new ROM image can be pre-flighted before it is flashed into ROM. In this embodiment, the new information stored in the second memory can be verified to ensure that it is safe to load the new information into the first memory. When a positive verification result is obtained, the new information is loaded from the second memory into the first memory such that the new information can be used for a subsequent startup of the computer system. In a specific embodiment, the present invention includes the above and wherein the first memory comprises a flash ROM. In one embodiment, the present invention includes the above and wherein the computer system is a PDA. In a preferred embodiment, the present invention includes the above and wherein the new information is received by the computer system via wireless communication.

8 Claims, 10 Drawing Sheets

METHOD AND APPARATUS FOR FAULT-TOLERANT UPDATE OF FLASH ROM CONTENTS

RELATED U.S. PATENT APPLICATION

This Application is a Continuation Application of the commonly-owned U.S. Patent Application Ser. No. 09/590,936, filed Jun. 8, 2000, now U.S. Pat No. 6,880,048 by S. Lemke, and entitled "Method and Apparatus for Fault-Tolerant Update of Flash ROM Contents."

BACKGROUND OF THE INVENTION

1. Field of the Invention

The present invention relates to the update of memory contents. More specifically, the present invention pertains to a method and apparatus for updating flash read only memory (ROM) contents in a fault-tolerant manner.

2. Related Art

Computer systems and other electronic devices have become integral tools that are used extensively to perform a wide variety of useful operations in modern society. Applications of computer systems can be found in virtually all fields and disciplines, including but not limited to business, industry, scientific research, education and entertainment. For instance, computer systems are used to analyze financial data, to control industrial machinery, to model chemical molecules, to deliver classroom presentations and to generate special effects for movies. Moreover, computer systems along with other electronic devices are finding new applications as a result of advances in hardware technology and rapid development in software technology. The growing affordability of computer systems and electronic devices together with the abundance of useful new applications have fueled strong demand for such systems and devices.

Included within this broad category of computers and electronic devices is the personal digital assistant (commonly referred to as a PDA). Specifically, as the components required to build a computer system have been greatly reduced in size, new categories of computer systems have emerged. One of these new categories of computer systems is the PDA. A PDA is a portable computer system which is small enough to be held conveniently and comfortably in the hand of its user. In particular, a popular size for the typical PDA approximates the size of a palm.

Since PDAs are such small devices, full-sized keyboards are generally not efficient input devices. For instance, PDAs using keyboards usually have keyboard devices that are so small that a user typically cannot touch-type on them. Many PDAs thus employ a stylus and a digitizer pad as an input system. The stylus and digitizer pad work well for PDAs because the arrangement allows a user to hold the PDA in one hand while writing with the stylus onto the digitizer pad with the other hand. A small on-screen keyboard image can also be used for data entry. By eliminating the need for a keyboard, PDAs are very portable and can be carried along by their users wherever they go, even when on extended travel.

Furthermore, the PDA is usually a battery-powered device that is typically used as an electronic organizer having the capability to store and display a wide range of information which can include numerous addresses and telephone numbers of business and personal acquaintances, financial information, daily appointments, along with various other personal information. As such, the PDA is able to consolidate a wide variety of information and make the information easily accessible by its user. Therefore, PDAs are very useful and have gained wide popularity.

Nevertheless, a problem exists with respect to the updating of certain memory contents in PDAs and other handheld devices and computer systems. More specifically, PDAs and portable systems typically store boot code and operating system (OS) code in a flash memory. Unfortunately, the existing process of updating such contents (e.g., boot code, OS code) in the flash ROM is inherently error-prone and may not be interrupted or else the ROM will be corrupted or unusable. As a result, users and developers of such devices often end up with incorrect or corrupted flash ROM contents if error occur during the update process. Once the flash ROM is loaded with incorrect or corrupted data, the device is rendered inoperable, and the only recourse is to mechanically disassemble the device, perform costly and laborious manual rework to remove and replace the corrupted flash ROM component, reassemble the device, and then perform testing to verify that the device is fully functional. This is highly inconvenient and renders the user experience less pleasant than it would otherwise have been. In the case of third party software developers who encounter this situation, such time-consuming and cumbersome retrofitting process can also result in significant delays in their product development cycle and/or missing milestones and customer commitments. Thus, it would be highly advantageous to provide a method and apparatus for updating flash ROM contents which minimizes the inconvenience and cost to users.

Additionally, a method and apparatus for updating flash ROM contents must not require complete revamping of existing computer systems. In other words, in implementing a viable method and apparatus for updating flash ROM contents, components that are well known in the art and are compatible with existing computer systems need to be used so that the cost of realizing the method and apparatus for updating flash ROM contents is low. By so doing, the need to incur costly expenditures for retrofitting existing computer systems or for building custom components is eliminated.

SUMMARY OF THE INVENTION

It would be advantageous to provide a method and apparatus for updating flash ROM contents that could be interrupted and where the updating can be done with minimal inconvenience to the user. Furthermore, it would also be advantageous for such method and apparatus to utilize components that are well known in the art and are compatible with existing computer systems such that the method and apparatus is widely compatible with other systems and applications and does not require extensive retrofitting.

Accordingly, the present invention provides a method and apparatus for an interruptable fault-tolerant update of flash ROM contents wherein the flash ROM does not become corrupted inadvertently. By so doing, embodiments of the present invention provide greatly enhanced user experience over existing implementations of flash ROM update mechanisms. Moreover, embodiments of the present invention can be efficiently implemented using components that are well known in the art and are compatible with existing computer systems. As such, the present invention delivers a method and apparatus that is widely compatible with other systems and applications and does not require extensive retrofitting. These and other advantages of the present invention not specifically mentioned above will become clear within discussions of the present invention presented herein.

More specifically, in one embodiment of the present invention, a method for updating the contents of a first memory of a computer system is provided. In this embodiment, new information intended for the first memory is received by the computer system from an external source, wherein the first memory is for storing Information that is required during startup of the computer system. The new information thus received is stored in a second memory of the computer system, where the second memory is capable of retaining information stored therein upon a restart of the computer system. The method of this embodiment further includes restarting the computer system without relying on the new information. In one embodiment, the new ROM image can be pre-flighted before it is flashed into ROM. In this embodiment, the new information stored in the second memory is verified to ensure that it is safe to load the new information into the first memory. Additionally, when a positive verification result is obtained, the new information is loaded from the second memory into the first memory such that the new information can be used for a subsequent startup of the computer system. In a specific embodiment, the present invention includes the above and wherein the first memory comprises a flash ROM. In one embodiment, the present invention includes the above and wherein the computer system is a PDA. In a preferred embodiment, the present invention includes the above and wherein the new information is received by the computer system via wireless communication.

Embodiments of the present invention include the above and wherein the new information comprises boot ROM code. Furthermore, embodiments of the present invention include the above and wherein the new information comprises operating system code.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

In the following detailed description of the present invention, a method and apparatus for fault-tolerant update of flash ROM contents, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "storing", "restarting", "verifying", "loading" or the like, refer to the action and processes of a computer system (e.g., FIG. 5), or similar electronic computing device, that manipulates and transforms data represented as physical (electronic) quantities within the computer system's registers and memories into other data similarly represented as physical quantities within the computer system memories or registers or other such information storage, transmission or display devices.

Figure 5:
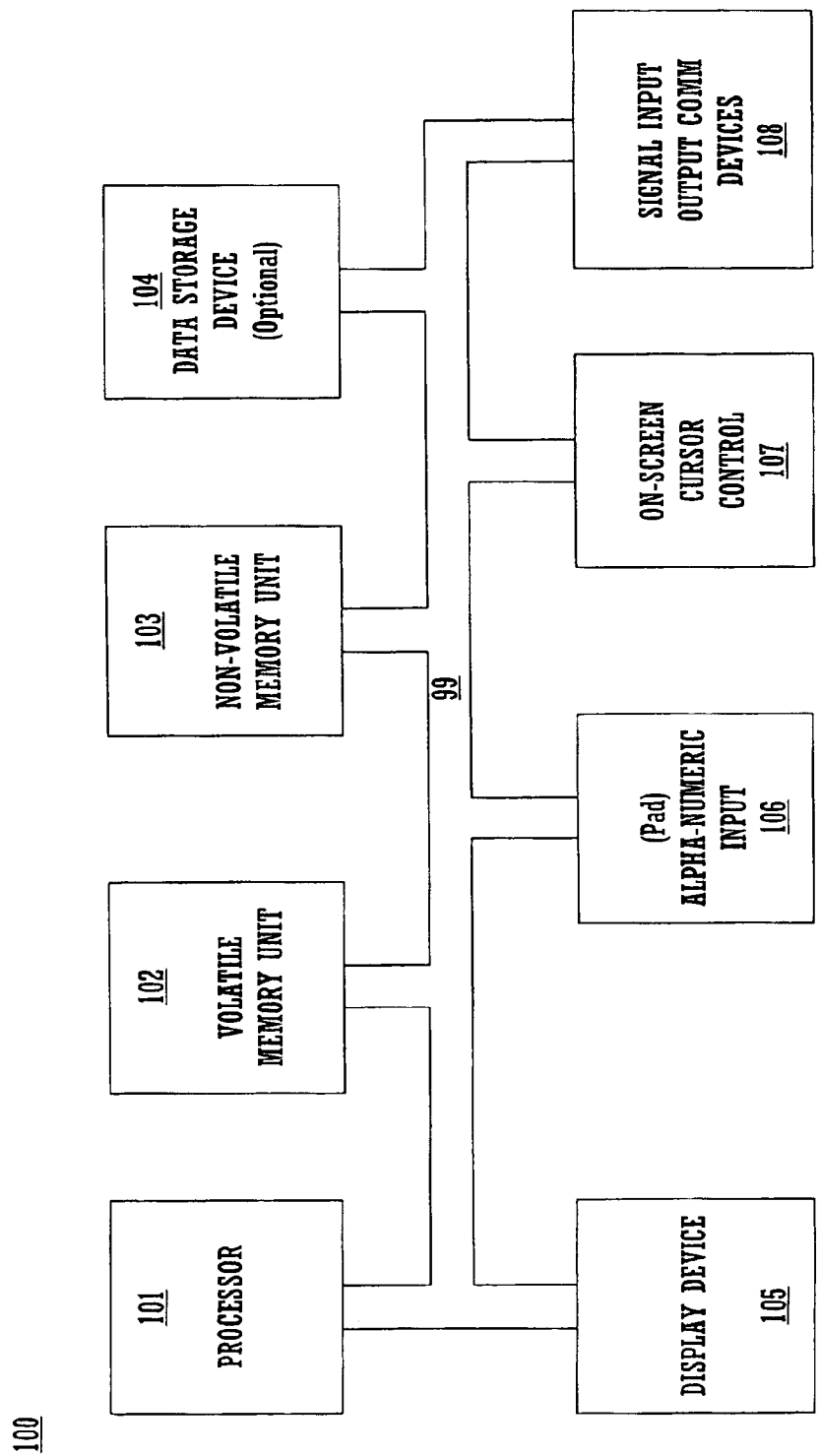
FIG. 5 is a logical block diagram of circuitry located within the exemplary personal digital assistant computer system of FIG. 2A.

Aspects of the present invention, described below, are discussed in terms of steps executed on a computer system. These steps (e.g., processes 600 and 700) are implemented as program code stored in computer readable memory units of a computer system and are executed by the processor of the computer system. Although a variety of different computer systems can be used with the present invention, an exemplary personal digital assistant computer system is shown in FIG. 5 further below.

AN ILLUSTRATIVE PERSONAL DIGITAL ASSISTANT (PDA) WITH WHICH EMBODIMENTS OF THE PRESENT INVENTION CAN BE PRACTICED

Figure 1:
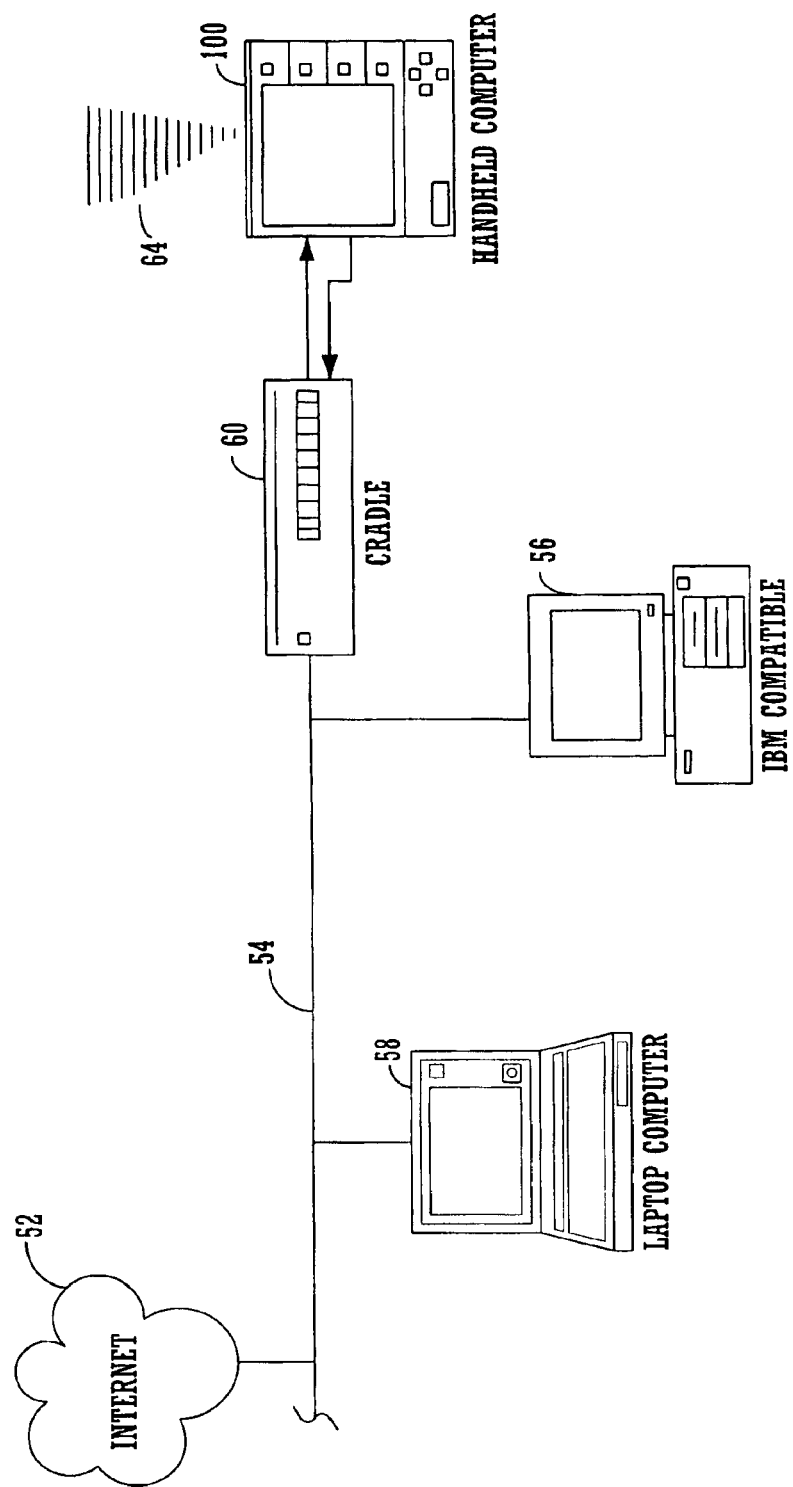
FIG. 1 is a system illustration of an exemplary personal digital assistant computer system connected to other computer systems and the Internet via a cradle device.

Referring now to FIG. 1, a system 50 that can be used in conjunction with the present invention is shown. It is appreciated that the method and apparatus for fault-tolerant update of flash ROM contents of the present invention can be used in conjunction with any computer system and that system 50 is illustrative rather than limiting. It is further appreciated that the portable computer system 100 described below is only exemplary. System 50 comprises a host computer system 56 which can either be a desktop unit as shown, or, alternatively, can be a laptop computer system 58. Optionally, one or more host computer systems can be used within system 50. Host computer systems 58 and 56 are shown connected to a communication bus 54, which in one embodiment can be a serial communication bus, but could be of any of a number of well known designs, e.g., a parallel bus, Ethernet, Local Area Network (LAN), etc. Optionally, bus 54 can provide communication with the Internet 52 using a number of well known protocols.

Importantly, bus 54 is also coupled to a cradle 60 for receiving and initiating communication with a personal digital assistant computer system 100. Cradle 60 provides an electrical and mechanical communication interface between bus 54 (and anything coupled to bus 54) and computer system 100 for two way communications. Computer system 100 also contains a wireless infrared communication mechanism 64 for sending and receiving information from other devices.

Figure 2A:
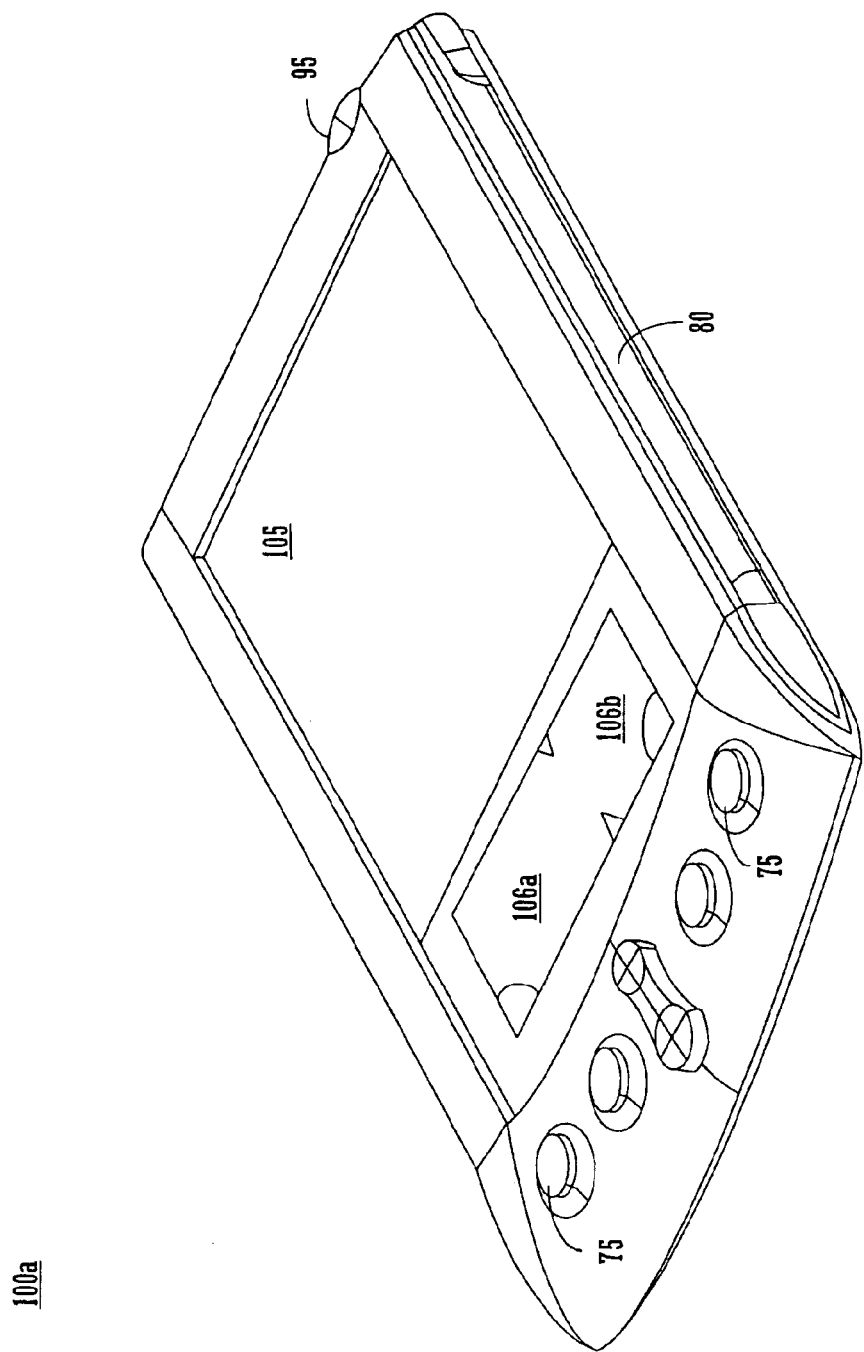
FIG. 2A is a top side perspective view of an exemplary personal digital assistant computer system.

With reference to FIG. 2A, a perspective illustration of the top face 100a of exemplary personal digital assistant computer system 100 is shown. Top face 110a contains a display screen 105 surrounded by a bezel or cover. A removable stylus 80 is also shown. Display screen 105 is a touch screen capable of registering contact between the screen and the tip of stylus 80. Stylus 80 can be fabricated of any material which can make contact with screen 105. Top face 100a also contains one or more dedicated and/or programmable buttons 75 for selecting information and causing computer system 100 to implement functions. An on/off button 95 is also shown.

Referring still to FIG. 2A, a handwriting recognition pad or "digitizer" containing regions 106a and 106b is also shown. Specifically, region 106a is for the drawing of alpha characters therein for automatic recognition and region 106b is for the drawing of numeric characters therein for automatic recognition. Stylus 80 is used for stroking a character within one of the regions 106a and 106b. The stroke information is then fed to an internal processor for automatic character recognition. Once characters are recognized, they are typically displayed on screen 105 for verification and/or modification.

Figure 2B:
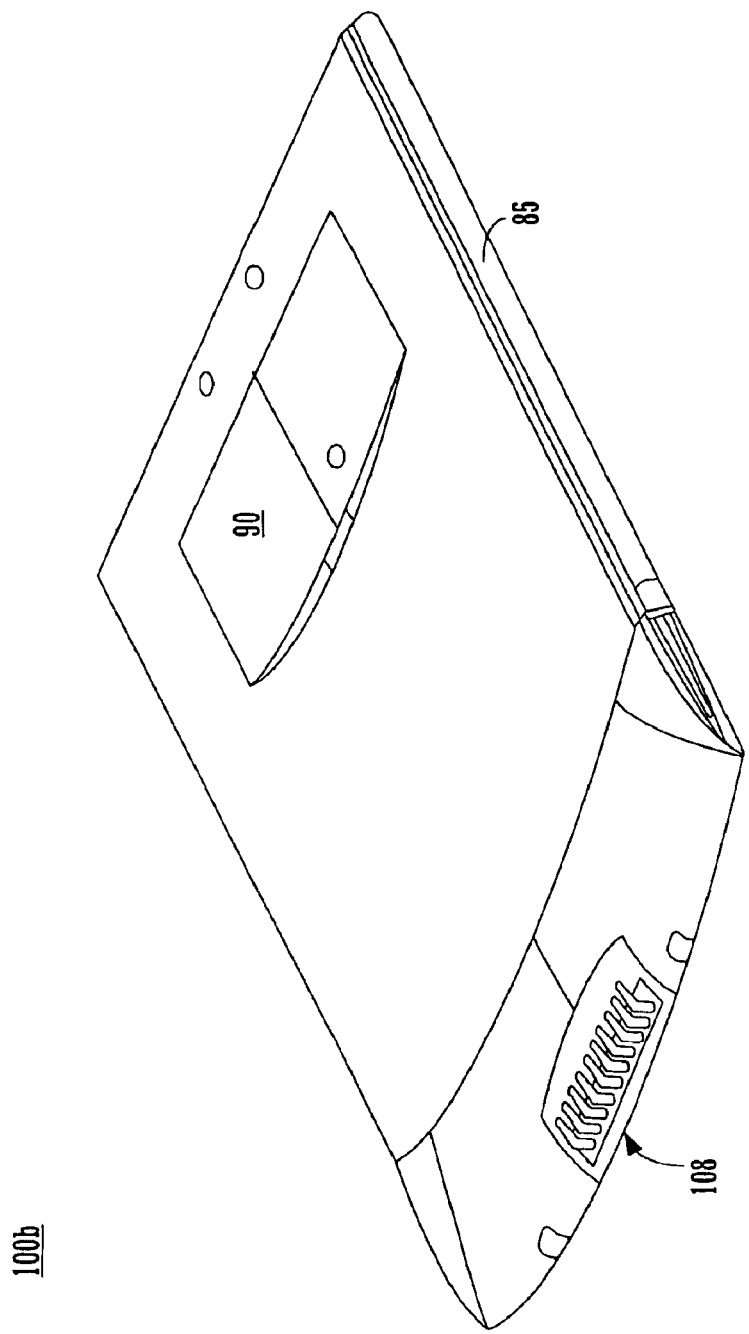
FIG. 2B is a bottom side perspective view of the personal digital assistant computer system of FIG. 2A.

FIG. 2B illustrates the bottom side 100b of one embodiment of personal digital assistant computer system 100. An optional extendible antenna 85 is shown, and a battery storage compartment door 90 is shown as well. A communication interface 108 is also shown. In one embodiment of the present invention, the serial communication interface 108 is a serial communication port, but it could also alternatively be of any of a number of well known communication standards and protocols, e.g., parallel, small computer system interface (SCSI), Ethernet, Firewire (IEEE 1394), etc.

Figure 3:
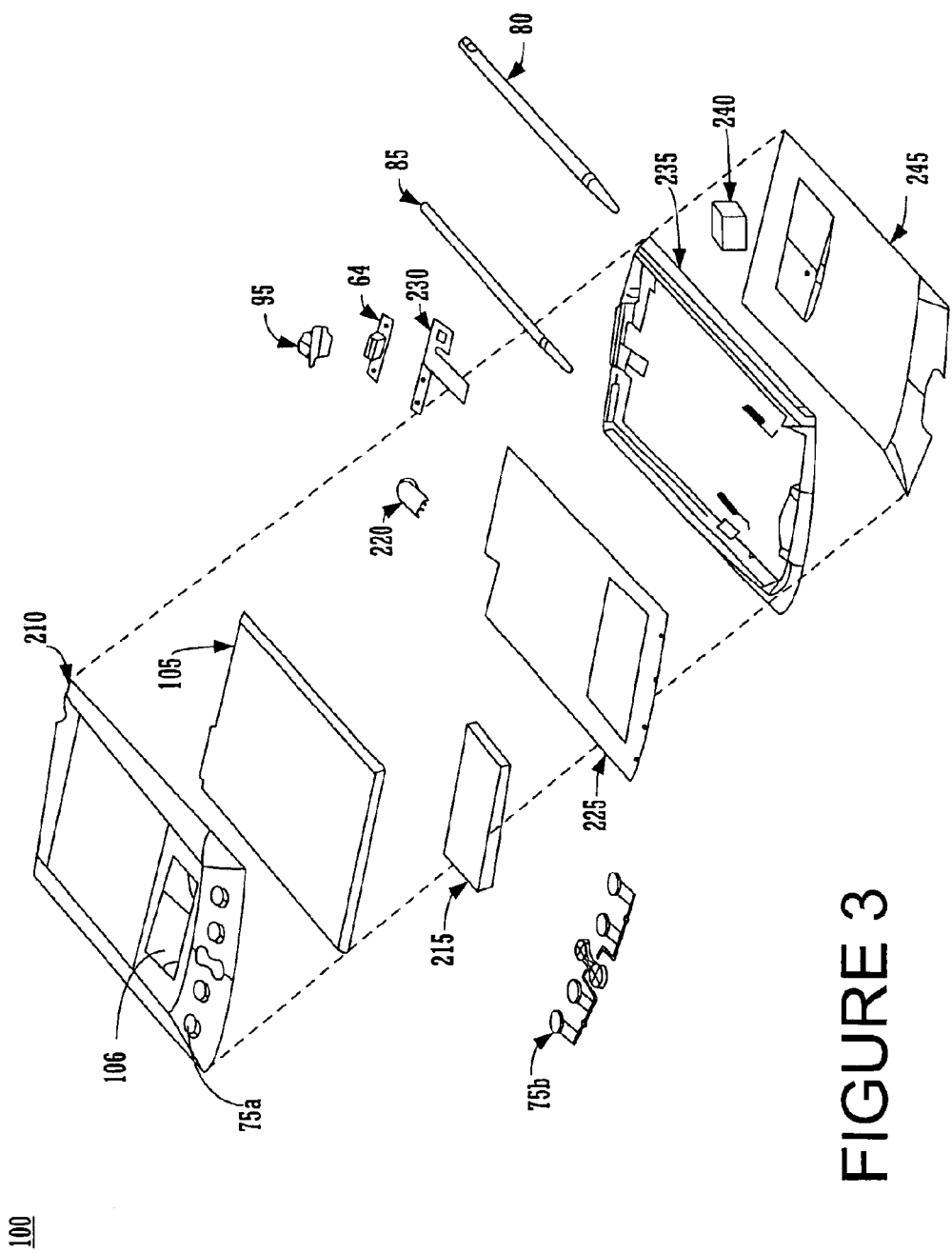
FIG. 3 is an exploded view of the components of the exemplary personal digital assistant computer system of FIG. 2A.

With reference now to FIG. 3, an exploded view of the exemplary personal digital assistant computer system 100 is shown. System 100 contains a front cover 210 having an outline of region 106 and holes 75a for receiving buttons 75b. A flat panel display 105 (both liquid crystal display and touch screen) fits into front cover 210. Any of a number of display technologies can be used, e.g., liquid crystal display (LCD), field emission device (FED), plasma, etc., for the flat panel display 105. A battery 215 provides electrical power. A contrast adjustment (potentiometer) 220 is also shown. On/off button 95 is shown along with an infrared emitter and detector device 64. A flex circuit 230 is shown along with a PC board 225 containing electronics and logic (e.g., memory, communication bus, processor, etc.) for implementing computer system functionality. The digitizer pad is also included in PC board 225. A midframe 235 is shown along with stylus 80. Position adjustable antenna 85 is also shown.

A radio receiver/transmitter device 240 is also shown between the midframe and the rear cover 245 of FIG. 3. Radio receiver/transmitter device 240 is coupled to antenna 85 and also coupled to communicate with PC board 225. In one implementation, the Mobitex wireless communication system is used to provide two way communication between system 100 and other networked computers and/or the Internet via a proxy server.

Figure 4:
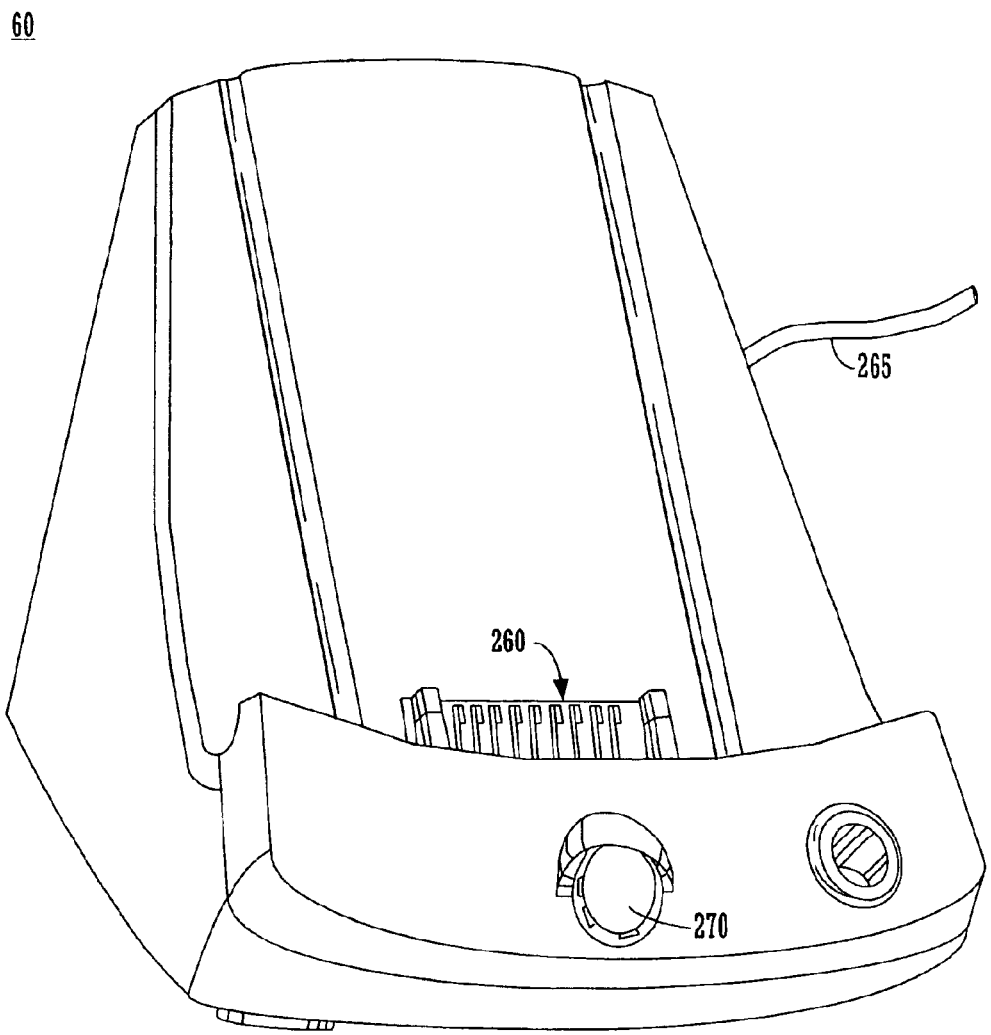
FIG. 4 is a perspective view of the cradle device for connecting the personal digital assistant computer system to other systems via a communication interface.

FIG. 4 is a perspective illustration of one embodiment of the cradle 60 for receiving the personal digital assistant computer system 100. Cradle 60 contains a mechanical and electrical interface 260 for interfacing with serial connection 108 (FIG. 2B) of computer system 100 when system 100 is slid into the cradle 60 in an upright position. Once inserted, button 270 can be pressed to initiate two way communication between system 100 and other computer systems coupled to serial communication bus 54.

Referring now to FIG. 5, a block diagram of exemplary personal digital assistant computer system 100 is shown. Some of the modules shown in FIG. 5 can be implemented on PC board 225. Computer system 100 includes an address/data bus 99 for communicating information, a central processor 101 coupled with bus 99 for processing information and instructions, a volatile memory unit 102 (e.g., random access memory, static RAM, dynamic RAM, etc.) coupled with bus 99 for storing information and instructions for central processor 101 and a non-volatile memory unit 103 (e.g., read only memory, programmable ROM, flash memory, EPROM, EEPROM, etc.) coupled with bus 99 for storing static information and instructions for processor 101. As described above, computer system 100 also contains a display device 105 coupled to bus 99 for displaying information to the computer user. PC board 225 can contain processor 101, bus 99, volatile memory unit 102, and nonvolatile memory unit 103. As described further below, portions of memory units 102 and 103 can be removed from computer system 100. Moreover, computer system 100 can also include an optional data storage device 104 (e.g., memory stick) for storing information and instructions. In one embodiment, optional data storage device 104 is removable from computer system 100.

Also included in computer system 100 of FIG. 5 is an optional alphanumeric input device 106 which, in one implementation, is a handwriting recognition pad ("digitizer") having regions 106a and 106b (FIG. 2A), for instance. Device 106 can communicate information and command selections to central processor 101. Computer system 100 also includes an optional cursor control or directing device 107 coupled to bus 99 for communicating user input information and command selections to central processor 101. In one implementation, device 107 is a touch screen device incorporated with screen 105. In this implementation, device 107 is capable of registering a position on screen 105 where a stylus makes contact. Display device 105 utilized with computer system 100 may be a liquid crystal device (LCD), cathode ray tube (CRT), field emission device (FED, also called flat panel CRT) or other display device suitable for creating graphic images and alphanumeric characters recognizable to the user. In a currently preferred embodiment, display 105 is a flat panel display. Computer system 100 also includes signal communication interface 108, which is also coupled to bus 99, and can be a serial port for communicating with cradle 60. Device 108 can also include an infrared communication port.

It is appreciated that computer system 100 described herein illustrates an exemplary configuration of an operational platform upon which embodiments of the present invention can be implemented. Nevertheless, other computer systems with differing configurations can also be used in place of computer system 100 within the scope of the present invention.

OPERATION OF THE FAULT-TOLERANT FLASH ROM UPDATE METHOD IN ACCORDANCE WITH THE PRESENT INVENTION

Figure 6:
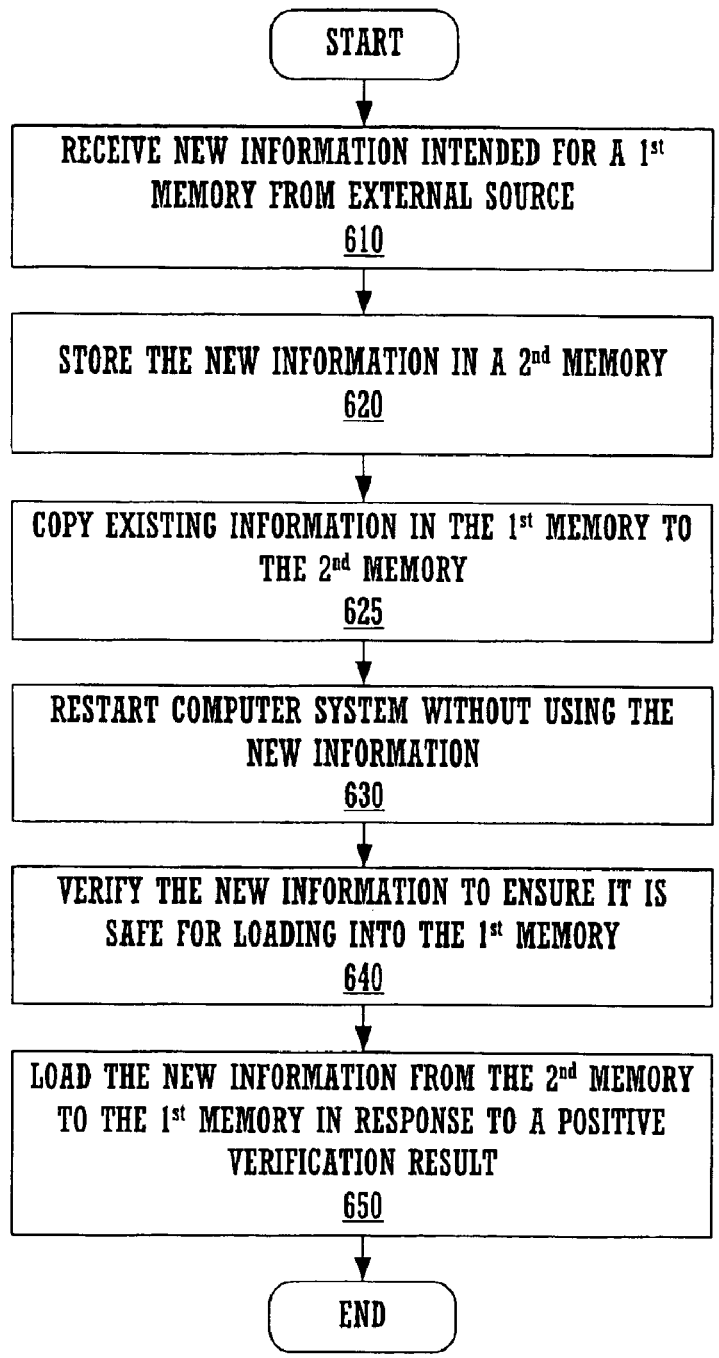
FIG. 6 is a flow diagram illustrating steps for updating the contents of a first memory of a computer system in accordance with one embodiment of the present invention.

Referring next to FIG. 6, a flow diagram illustrating steps for updating the contents of a first memory of a computer system in accordance with one embodiment of the present invention is shown. In step 610, new information intended for the first memory is received by the computer system from an external source, wherein the first memory is for storing information that is required during startup of the computer system. In a currently preferred embodiment, the first memory comprises a flash ROM.

In one embodiment, the computer system is a PDA. In another embodiment, the external source is also a PDA. Moreover, in a currently preferred embodiment, the new information is received by the computer system via wireless communication (e.g., infrared beaming). It is appreciated that various forms of data communication, wired or wireless-based, can also be used within the scope of the present invention.

Moreover, in one embodiment wherein the computer system is a PDA such as the Palm™ PDA, the new information, which is intended for the first memory but is stored in the second memory meanwhile, comprises boot ROM code. In another embodiment, the new information comprises operating system (OS) code (e.g., Palm™ OS code). Importantly, since the new information (e.g., new ROM code, new OS code) is hot loaded into the first memory (e.g., flash ROM), the startup process is not dependent upon this untested new information. As a result, even if the new information turns out to be corrupted, incorrect, or otherwise incompatible with the computer system, the system will not be rendered inoperable because the existing and functional code is unaltered in the first memory. As such, this embodiment of the present invention advantageously eliminates the irreversible uninterruptable and error-prone aspects of prior implementations of flash ROM updates.

In an alternative embodiment, the first memory (e.g., flash ROM) of the computer system has no contents stored therein initially. In this embodiment, the new information (e.g., new ROM code) is treated in the same manner as if the first memory has existing contents, except that the first memory will simply be populated rather than having its contents replaced if and when the new information is eventually loaded into the first memory, as will be described in detail with reference to the other steps of the instant process 600 further below.

Referring still to FIG. 6, in step 620, the new information is stored in a second memory of the computer system, where the second memory is capable of retaining information stored therein upon a restart of the computer system. In one embodiment, the second memory comprises a random-access memory (RAM).

Figure 8A:
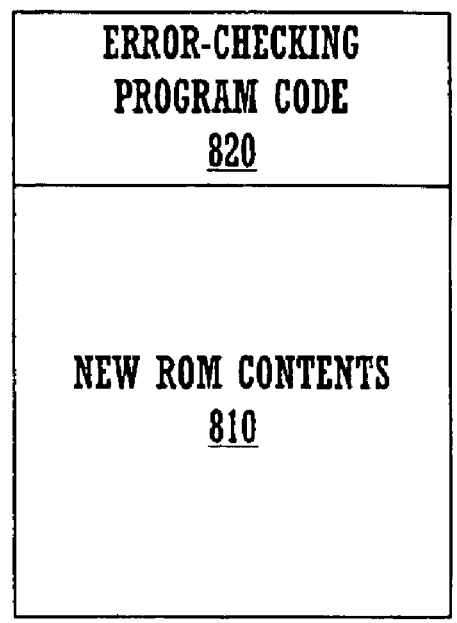
FIG. 8A is a block diagram illustrating the logical arrangement of error-checking program code and new ROM contents in accordance with one embodiment of the present invention.
Figure 8B:
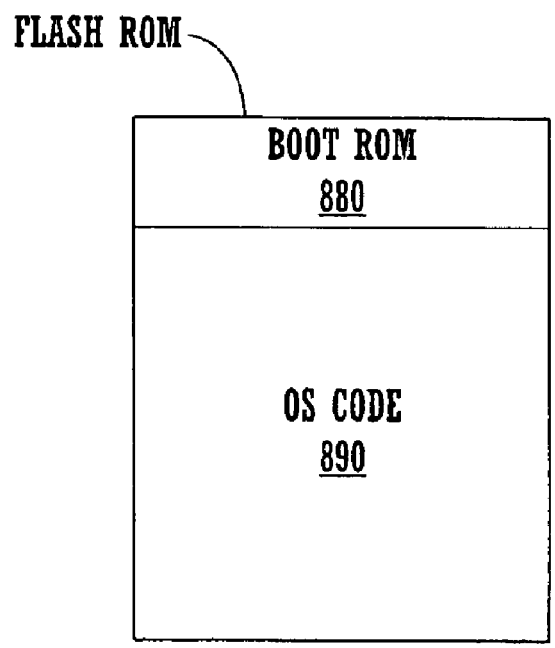
FIG. 8B is a block diagram illustrating the logical arrangement of boot ROM code and OS code in a flash ROM in accordance with one embodiment of the present invention.

In a currently preferred embodiment, program code for error-checking is "wrapped around," or appended to, the new information and stored into the second memory. As is depicted in FIG. 8A, in an embodiment where the computer system is a Palm™ PDA, the new ROM contents 810 with the program code 820 appended thereto, resembles a regular Palm application (e.g., in the form of a .prc file written for the Palm™ OS). Moreover, as shown in FIG. 8B, the first memory (e.g., flash ROM) of the system typically comprises two images, namely, boot ROM 880 and OS code 890. It is appreciated that embodiments of the present invention can be applied to implement fault-tolerant update of boot ROM code 880, or OS code 890, or both, provided that proper modifications are made to new information 810 and program code 820 accordingly.

Referring still to FIG. 6, in optional step 625, existing information in the first memory is copied to the second memory such that the existing information can be restored into the first memory should the first memory become corrupted. In other words, this embodiment advantageously provides an "undo" capability for the flash ROM update process.

With reference still to FIG. 6, in step 630, the computer system is restarted without relying on the new information. As described above, it is appreciated that in accordance with this embodiment of the present invention, the new information remains in the second memory and not stored in the first memory. As such, upon the system restart, the new information is not used or otherwise relied upon by the computer system. In an embodiment where optional step 625 is performed, should the first memory become corrupted for an unanticipated reason, the first memory can be restored to its uncorrupted state by using the image stored in the second memory by step 625.

Referring again to FIG. 6, in step 640, the new information stored in the second memory is verified to ensure that it is safe to load the new information into the first memory.

In one embodiment, the verification as described in step 640 includes checking the version or the date stamp of the new information that is stored in the second memory to ensure that the new information is suitable for the computer system. For instance, the date stamp of the new information is compared against that of the existing information in the first memory to ensure that the new information is indeed newer or more up-to-date than the existing information residing in the first memory. In another embodiment, the version of the new information is verified against hardware specifications of the computer system to ensure that the new information is indeed compatible with the computer system.

In yet another embodiment, a checksum test is performed on the new information as it is stored in the second memory to ensure that the new information is free from corruption. In still another embodiment, the power level of the computer system is examined to ensure that the loading of the new information from the second memory to the first memory, if performed as described below in step 650, can be completed without being interrupted by a power failure.

With reference again to FIG. 6, in step 650, when a positive verification result is obtained in step 640, the new information is loaded from the second memory into the first memory such that the new information can be used for a subsequent startup of the computer system. A method for updating the flash ROM contents in accordance with embodiments of the present invention is thus described.

Figure 7:
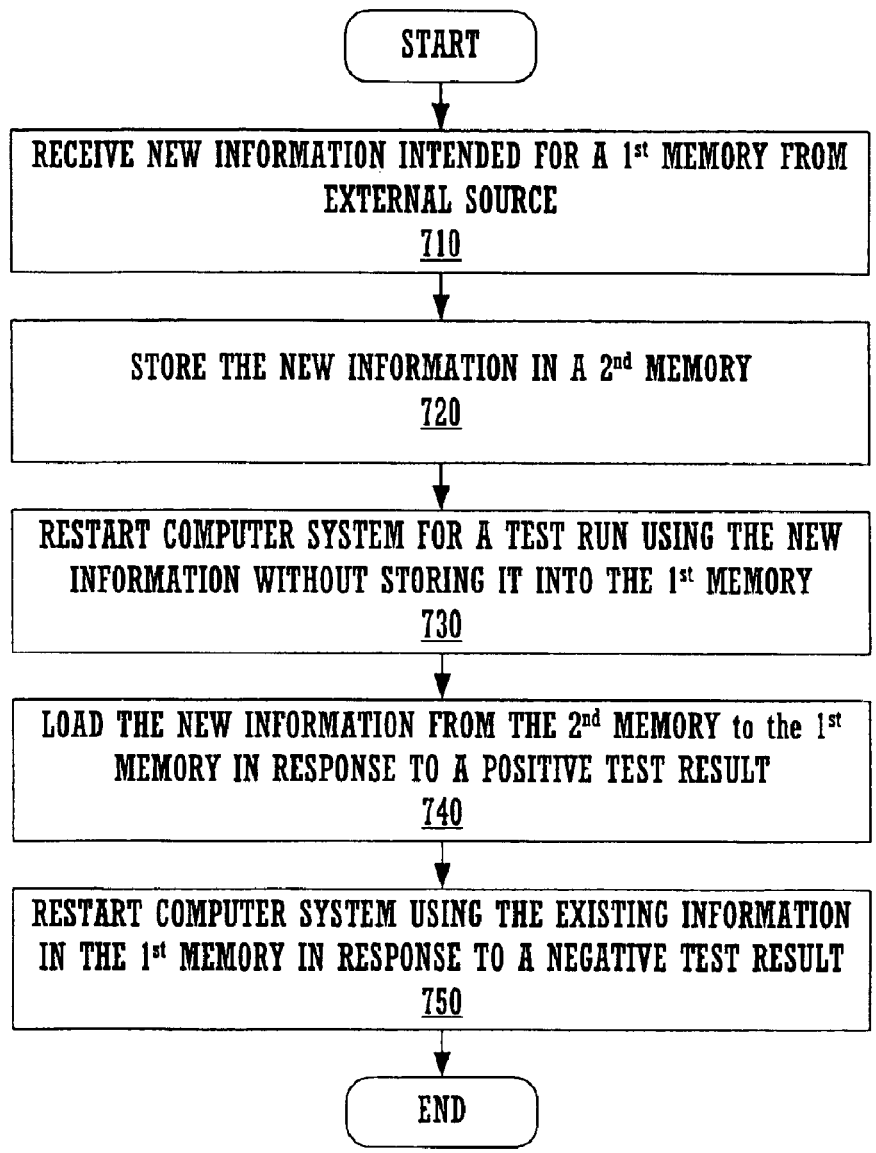
FIG. 7 is a flow diagram illustrating steps for updating the contents of a first memory of a computer system in accordance with another embodiment of the present invention.

Referring next to FIG. 7, a flow diagram illustrating steps for updating the contents of a first memory of a computer system in accordance with another embodiment of the present invention is shown. In step 710, new Information intended for the first memory is received by the computer system from an external source, wherein the first memory is for storing information that is required during startup of the computer system. In a currently preferred embodiment, the first memory comprises a flash ROM.

In one embodiment, the computer system is a PDA. In another embodiment, the external source is also a PDA. Moreover, in a currently preferred embodiment, the new information is received by the computer system via wireless communication (e.g., infrared beaming). It is appreciated that various forms of data communication, wired or wireless-based, can also be used within the scope of the present invention.

Moreover, in one embodiment wherein the computer system is a PDA such as the Palm™ PDA, the new information, which is intended for the first memory but is stored in the second memory meanwhile, comprises boot ROM code. In another embodiment, the new information comprises operating system (OS) code (e.g., Palm™ OS code). Importantly, since the new information (e.g., new ROM code, new OS code) is not loaded into the first memory (e.g., flash ROM), the contents of the first memory remains intact. As a result, even if the new information turns out to be corrupted, incorrect, or otherwise incompatible with the computer system, the system will not be rendered inoperable because the existing and functional code is unaltered in the first memory. As such, this embodiment of the present invention advantageously eliminates the irreversible and error-prone aspects of prior implementations of flash ROM updates.

Referring still to FIG. 7, in step 720, the new information is stored in a second memory of the computer system, where the second memory is capable of retaining information stored therein upon a restart of the computer system. In one embodiment, the second memory comprises a random-access memory (RAM).

With reference still to FIG. 7, in step 730, the computer system is restarted using the new information in the second memory Instead of existing information in the first memory to test the new information. As described above, it is appreciated that in accordance with this embodiment of the present invention, the new information remains in the second memory and not stored in the first memory.

Referring again to FIG. 7, in step 740, when a positive test result is obtained in step 730, the new information is loaded from the second memory into the first memory such that the new information can be used for a subsequent startup of the computer system.

With reference again to FIG. 7, in step 750, when a negative test result is obtained in step 730, the computer system is restarted using the existing information in the first memory. In this case, the new information is not loaded from the second memory into the first memory. By so doing, corruption of the first memory is advantageously avoided. Thus, this embodiment of the present invention provides a mechanism for performing riskless "test runs" of the new information (e.g., new ROM code, new OS code) without the danger of irreversibly corrupting the first memory (e.g., flash ROM). A method for updating the flash ROM contents in accordance with embodiments of the present invention is thus described.

Significantly, embodiments of the present invention as described above enable any user or developer who needs to update the flash ROM contents of a computer system to accomplish the task conveniently and in a fault-tolerant manner. Importantly, the user does not have to get directly involved with the underlying aspects of the present invention. More specifically, the user just needs to enable the receipt of the new information (e.g., boot ROM code, OS code) by the computer system (e.g., by beaming the new information from a source PDA to the PDA that needs the update via an infrared port) and the process proceeds automatically in accordance with the present invention without any further user intervention. As such, the present invention provides a mechanism which facilitates the fault-tolerant update of flash ROM contents which is superior to prior implementations for the same.

Furthermore, since embodiments of the present invention utilize components that are already parts of the computer system and that are well known in the art, such as flash ROM and RAM, embodiments of the present invention can be efficiently implemented and afford advantageous compatibility with other systems and applications, thereby greatly enhancing the user experience while minimizing the cost to the user.

Although certain embodiments of the present invention as described herein pertains to PDAs, it is appreciated that many other advantageous applications are possible within the scope of the present invention. For example, the present invention can be advantageously applied to the flash ROM update of numerous other devices, such as digital cameras and media players, among others. Therefore, the present invention enables numerous possibilities in modern society where a wide range of systems and appliances include flash memory of one kind or another whose contents require occasional or periodic updates. It should be clear to a person of ordinary skill in the art, having read the description of embodiments of the present invention herein, that other applications and embodiments not expressly described herein are also possible without departing from the scope and spirit of the present invention.

The preferred embodiment of the present invention, a method and apparatus for fault-tolerant update of flash ROM contents, is thus described. While the present vention has been described in particular embodiments, it should be appreciated that the present invention should not be construed as limited by such embodiments, but rather construed according to the below claims.

What is claimed is:

1. A method for updating contents of a first memory of a computer system, said method comprising the steps of:

a) receiving new information intended for said first memory from an external source, said first memory for storing information that is required during startup of said computer system;

b) storing said new information in a second memory of said computer system, said second memory capable of retaining information stored therein upon a restart of said computer system;

c) restarting said computer system using said new information in said second memory instead of existing information in said first memory to test said new information;

d) responsive to a positive test result from said step c), loading said new information from said second memory into said first memory such that said new information can be used for a subsequent startup of said computer system; and e) responsive to a negative test result from said step c), restarting said computer system using said existing information in said first memory.

2. The method as recited in claim 1 wherein said first memory comprises a flash read-only memory (ROM).

3. The method as recited in claim 1 wherein said second memory comprises a random-access memory (RAM).

4. The method as recited in claim 1 wherein said computer system is a personal digital assistant (PDA).

5. A computer system comprising:

a processor;

a first memory, coupled to said processor, for storing information that is required during startup of said computer system;

an input output device, coupled to said processor, for receiving new information intended for said first memory from an external source;

a second memory, coupled to said processor, for storing said new information, said second memory capable of retaining information stored therein upon a restart of said computer system;

said processor for restarting said computer system using said new information in said second memory instead of existing information in said first memory to test said new information; said processor further for loading said new information from said second memory into said first memory such that said new information can be used for a subsequent startup of said computer system in response to a positive test result from said restarting; and said processor also for restarting said computer system using said existing information in said first memory in response to a negative test result from said restarting.

6. The computer system of claim 5 wherein said first memory comprises a flash read-only memory (ROM).

7. The computer system of claim 5 wherein said second memory comprises a random-access memory (RAM).

8. The computer system of claim 5 wherein said computer system is a personal digital assistant (PDA).

* * * * *